(12) United States Patent
Nong

(10) Patent No.: US 6,885,591 B2
(45) Date of Patent: Apr. 26, 2005

(54) PACKET BUFFER CIRCUIT AND METHOD

(75) Inventor: Ge Nong, KLN (HK)

(73) Assignee: STMicroelectronics, Inc., Carrollton, TX (US)

(*) Notice: Subject to any disclaimer, the term of this patent is extended or adjusted under 35 U.S.C. 154(b) by 0 days.

(21) Appl. No.: 10/627,843

(22) Filed: Jul. 25, 2003

(65) Prior Publication Data

US 2005/0018492 A1 Jan. 27, 2005

(51) Int. Cl.[7] ............................................. G11C 16/04
(52) U.S. Cl. .......................... 365/189.05; 365/189.01; 365/189.07
(58) Field of Search .................. 365/189.05, 189.01, 365/189.07

(56) References Cited

U.S. PATENT DOCUMENTS 5,926,424 A * 7/1999 Abe .......................... 365/201

OTHER PUBLICATIONS

Iyer, et al., "Analysis of a Memory Architecture for Fast Packet Buffers", In Proc. IEEE HPSR, Dallas, Texas, pp. 368–373; 2001, 7803–6711–1/01.

Mike Clendenin; "IBM shows faster approach to embedded DRAM", EE Times, Jun. 10, 2002. URL: htttp://www.embedded.com/showArticle.jhtml?articleID=10804520.

* cited by examiner

Primary Examiner—Son T. Dinh
Assistant Examiner—Pho M. Luu
(74) Attorney, Agent, or Firm—Lisa K. Jorgenson; Andy M. Szuwalski

(57) ABSTRACT

A method and circuit buffer for temporarily holding packets of information. The buffer may include a first memory and a second memory for holding the packets of information. The first memory may be a read-once memory in which data stored in the first memory is destroyed upon being read therefrom the first time. The second memory may be a memory in which stored data therein is not destroyed following the data being read from the second memory the first time. The buffer includes at least one queue. The head-of-line packet of the at least one queue is stored in the second memory. Incoming fanout splitting packets are stored in the second memory and other incoming packets are initially stored in the first memory.

25 Claims, 2 Drawing Sheets

PACKET BUFFER CIRCUIT AND METHOD

BACKGROUND OF THE INVENTION

1. Technical Field of the Invention

The present invention relates to a buffer for storing information, such as packetized data.

2. Description of the Related Art

Driven by growing bandwidth demands from the ever-increasing population of network users, there is a relatively large market for various kinds of networking 10 equipment. Among them, packet networking systems such as packet switches and routers are the key building blocks of networking infrastructures.

Generally, a packet switch/router performs two major functions: packet routing and forwarding. The former looks up the route-table to decide where an incoming packet will be forwarded (i.e., by which output port of the switch/router that the packet will leave); and the latter executes the actual forwarding operations. Before a packet can be forwarded to the next hop, due to resource contentions or other reasons, it may need to be stored in a packet buffer somewhere in the switch/router. In order to absorb temporary traffic congestions, fast and dense packet buffers are indispensable for the building of a high-performance fast packet switches/routers. Further, intensive research on high-speed switches/routers in the past decade have revealed that packet buffers used in a switch/router constitute a bottleneck for cost reducing and performance improving. Up to now, it still remains a difficult challenge to make fast and dense packet buffers which meet the needs of high-speed networking applications.

Packet buffers are generally solid-state random access memories (RAM) built by CMOS technologies. Generally speaking, those CMOS RAMs can be classified into two major categories: static random access memory (SRAM) and dynamic random access memory (DRAM). The former is faster and the latter is denser. On one hand, one can build a fast and small buffer using SRAM; on the other hand, one can build a slow and dense buffer using DRAM. However, neither pure SRAM nor pure DRAM can build a desired fast and dense packet buffer.

A two-hierarchy SRAM+DRAM architecture was previously proposed in the art to build a first-in-first out (FIFO) fast and dense packet buffer. In this architecture, a DRAM provides the main storage capacity and a small SRAM is located between the external access interface and the DRAM to serve as a cache for access acceleration. Further, special properties held by FIFO packets are utilized to pipeline the operations of SRAM and DRAM. While this solution may represent a right direction for attacking the intended problem, nevertheless, it requires a sophisticated scheduler and limits its applicability to FIFO buffers only, which offsets the benefits obtained from this solution.

Based upon the foregoing, there is a need for a packet buffer which is sufficiently sized to hold a relatively large number of packets, sufficiently fast to accommodate relatively high speed communication and relatively simple in implementation.

SUMMARY OF THE INVENTION

Embodiments of the present invention overcome shortcomings associated with prior packet buffers and satisfy a significant need for a relatively fast and dense buffer for storing packets of data.

According to an exemplary embodiment of the present invention, there is provided a buffer including a first memory and a second memory, the second memory being less dense but faster than the first memory. At least one queue is associated with the first and second memories and serves as a pointer to point to the locations in the first and second memories where data packets are stored. Incoming data packets are initially stored in the first memory. Individual data packets are subsequently transferred from the first memory to the second memory upon the individual data packet becoming the head-of-line (HOL) packet, i.e., the packet appearing at the top of the at least one queue. By maintaining the head-of-line packets in the fast second memory while maintaining the remaining packets in the denser first memory, the buffer is advantageously capable of providing better performance in a relatively efficient manner.

A method of operation may include storing incoming packets of data in a first memory, the packets being associated with the at least one queue, and transferring a first packet of the incoming packets from the first memory to the second memory upon the first packet becoming the head 10 of-line packet for the at least one queue. The first packet is sent to a telecommunications device following the first packet being stored in the second memory.

BRIEF DESCRIPTION OF THE DRAWINGS

A more complete understanding of the system and method of the present invention may be obtained by reference to the following Detailed Description when taken in conjunction with the accompanying Drawings wherein.

DETAILED DESCRIPTION OF THE EXEMPLARY EMBODIMENTS

The present invention will now be described more fully hereinafter with reference to the accompanying drawings in which exemplary embodiments of the invention are shown. This invention may, however, be embodied in many different forms and should not be construed as being limited to the embodiments set forth herein. Rather, the embodiments are provided so that this disclosure will be thorough and complete, and will fully convey the scope of the invention to those skilled in the art.

Figure 1:
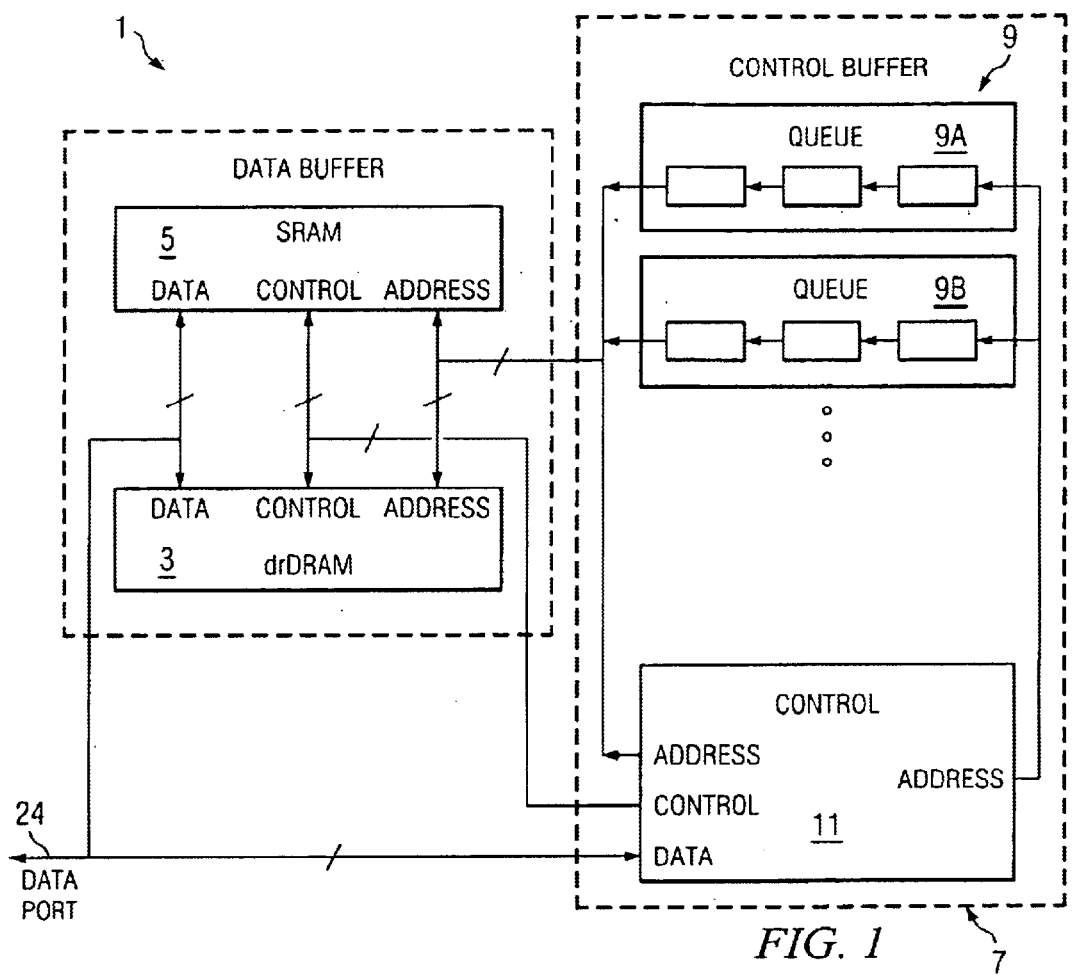
FIG. 1 is a block diagram of a packet buffer according to an exemplary embodiment of the present invention.

Referring to FIG. 1, there is shown a packet buffer 1 according to an exemplary embodiment of the present invention. Packet buffer 1 is adapted for relatively high-speed applications, such as use in telecommunications networks. Packet buffer 1 may include a first memory 3 and a second memory 5 that is faster but less dense than first memory 3. Packet buffer 1 may include a control buffer 7 for pointing to locations in first memory 3 and second memory 5 where individual data packets are stored. In general terms, packet buffer 1 transfers data packets between first memory 3 and second memory 5 based upon the status of control buffer 7.

As stated above, first memory 3 is larger than second memory 5 but has slower access times than second memory 5. According to the exemplary embodiment of the present invention, first memory 3 is a dynamic random memory (DRAM). In order to provide even faster read access times, first memory 3 may be a destructive-read DRAM (drDRAM). In other words, first memory 3 may be a DRAM in which a piece of data read from the DRAM is destroyed and no longer maintained in the DRAM. In a destructive-read DRAM, a write-back cycle does not follow a read cycle so as to restore the data read from the drDRAM. First memory 3, in this case, operates as a read-once memory. Because write-back cycles are not performed in the drDRAM, first memory 3 provides noticeably faster access times, relative to conventional DRAMs which perform write-back cycles.

In choosing the particular configuration for first memory 3, a pair of competing interests may be considered. On one hand, there is a desire to configure first memory 3 as having relatively fewer rows of memory cells, each of which has a relatively large number of memory cells. Because first memory 3 is a dynamic memory, it must be periodically refreshed, so fewer rows of memory cells advantageously result in the total refresh time for refreshing first memory 3 being reduced. Consequently, the amount of time available for accessing first memory 3 increases.

On the other hand, it is advantageous for reasons of data storage efficiency to have a relatively large number of rows, each of which contains a relatively few number of memory cells. Consider a packet stored in consecutive memory cells of first memory 3. If even a single memory cell in a row is used for storing a packet, the contents of the remaining memory cells in the row will be lost when the packet is read from first memory 3, due to first memory 3 being a drDRAM. In order to avoid the loss of packet data, first memory 3 may be utilized such that each row of memory cells may only store information corresponding to a single packet of information. However, this utilization of first memory 3 disadvantageously results in memory cells being unused. To address the need for a drDRAM having a relatively small number of relatively large memory cell rows as well as the need for a drDRAM having a relatively large number of relatively small rows, first memory 3 may be configured as follows.

According to an exemplary embodiment of the present invention, first memory 3 may utilize the concept of logical rows when accessing memory cells. Specifically, a physical row in first memory 3 may be divided into two or more "logical" rows, each of which is individually addressed. In other words, a logical row may be accessed for performing a read operation without accessing the other logical row(s) in the same physical row as the accessed logical row. In this way, only an accessed logical row(s) in a physical row will lose its data following a memory read operation to the accessed logical row. By storing information from different packets in different logical rows in the same physical row, the utilization of logical rows in first memory 3 for storing and retrieving packets allows for the physical rows of first memory 3 to be relatively large. Consequently, data storage efficiency is increased while total refresh time is decreased.

The utilization of logical rows may be implemented using a two level addressing hierarchy. For example, first memory 3 may have a multi-divided word line architecture wherein each logical row in a physical row has a distinct word line. In this way, each logical row is individually addressable, so information from more than one packet may be stored in the same physical row of memory cells. Further, the word lines for addressing memory cells in each physical row also may be enabled at the same time. This allows for multiple logical rows in the same physical row to store information from the same packet, and also allows for a refresh operation to advantageously refresh an entire physical row of memory cells at the same time.

Second memory 5 is adapted to provide faster access times than the access times provided by first memory 3. In accordance with an exemplary embodiment of the present invention, second memory 5 may be a conventional static random access memory (SRAM) that maintains its stored data values following access thereof. Alternatively, second memory 5 may be another type of memory that maintains stored data values following the stored data being read therefrom.

Control buffer 7 may include one or more queues 9. For each queue 9, each entry of the queue serves as a pointer to a physical address location in first memory 3 or second memory 5 where a corresponding data packet is stored. Each queue 9 may perform as a first-in-first-out (FIFO) memory in which the order of data read from the FIFO follows the order of data written thereto. In the event control buffer 7 includes two or more queues 9, each queue 9 may store data packets corresponding to a certain characteristic. For example, data packets may be organized in queues 9 according to packet destination or Quality of Service (QoS) class.

The one or more queues 9 may be implemented using at least one SRAM, as is known in the art. Control buffer 7 may further include control circuitry 11 which receives packets, generates corresponding address values for the data packet and determines the particular queue 9 into which the address values are to be stored. Further, control circuitry 11 may generate necessary control signals (CE, RD/WRB, etc.) provided to first memory 3 and second memory 5 for storing received packets therein, i.e., for causing first memory 3 and second memory 5 to selectively perform memory access operations. Control circuitry 11 may also control the transfer of packets from first memory 3 to second memory 5, as will be described in greater detail below. Control circuitry 11 may be implemented with timing and/or logic circuitry for controlling queues 9, first memory 3 and second memory 5.

It is understood that circuitry other than control circuitry 11 may be used to provide control signals for controlling first memory 3 and second memory 5 in order to store received packets.

Figure 2:
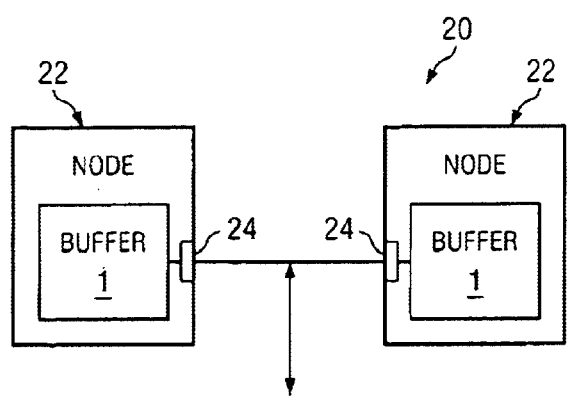
FIG. 2 is a block diagram of a system having the packet buffer of FIG. 1 therein.

FIG. 2 illustrates a system or network 20 in which packet buffer 1 may be utilized. System 20 may include a plurality of nodes 22, each of which is capable of communicating packets of data to each other and to other devices located in the system or elsewhere. Each node 22 may include at least one packet buffer 1, which is coupled to at least one communications port 24 through which packets of information may be transmitted and received.

Figure 3:
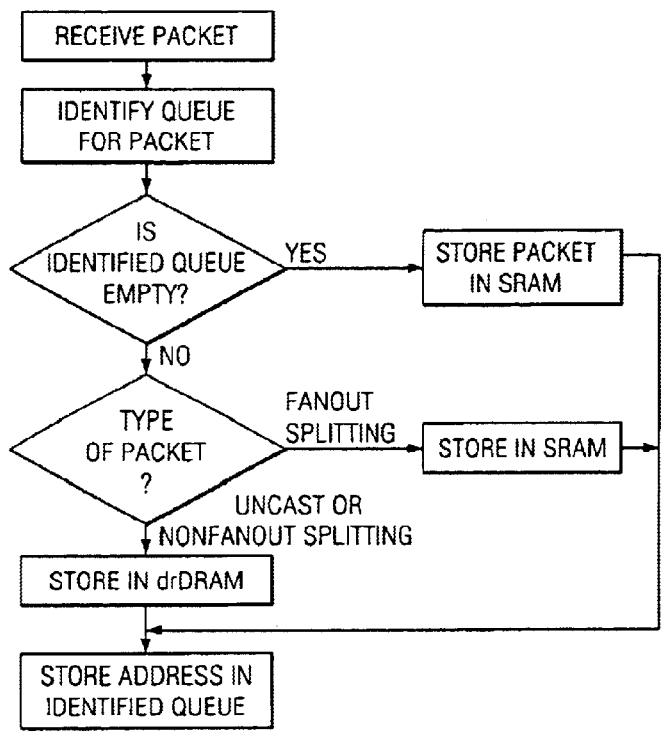
FIG. 3 is a flow chart illustrating an operation of the packet buffer of FIG. 1.

The operation for receiving a packet in accordance with an exemplary embodiment of the present invention will be described with reference to FIG. 3. It is understood that embodiments of the present invention are not necessarily limited to the particular order of steps described below and illustrated in FIG. 3. Rather, the order of steps may be reasonably modified from that described and illustrated.

In the event that a packet received at a node 22 cannot be immediately forwarded to another node, the packet may be received by packet buffer 1 for temporary storage therein. Initially, control circuitry 11 or other control or decode circuitry (not shown) in packet buffer 1 identifies the particular queue 9 to which the received packet is to be associated. Queue identification may be performed, for example, by examining the header of the packet associated with the received packet. Next, a determination is made, such as by control circuitry 11, as to whether the identified queue 9 is empty or instead contains at least the address of the HOL packet. In the event the identified queue 9 is empty, the received packet is stored in second memory 5 (SRAM) and the address of the received packet is stored in the identified queue 9. This ensures that the HOL packet of the identified queue 9 is available from second memory 5 when the HOL packet is to be delivered from packet buffer 1 to the next communications node 22.

However, if the identified queue 9 is not empty, a determination is made, such as by control circuitry 11, as to the type of the received packet. In the event the received packet is a fanout splitting multicast packet and therefore capable of being forwarded to a number of destinations individually at separate times, the received packet is stored in second memory 5 (SRAM). By being stored in second memory 5, the received packet is advantageously available to be read from second memory 5 a number of times (for multiple transmissions) without being corrupted.

If the identified queue 9 is not empty and if the received packet is a nonfanout splitting multicast packet or a unicast packet and therefore be capable of being forwarded to a destination node at a single time, the received packet is stored in first memory 3 (drDRAM).

Figure 4:
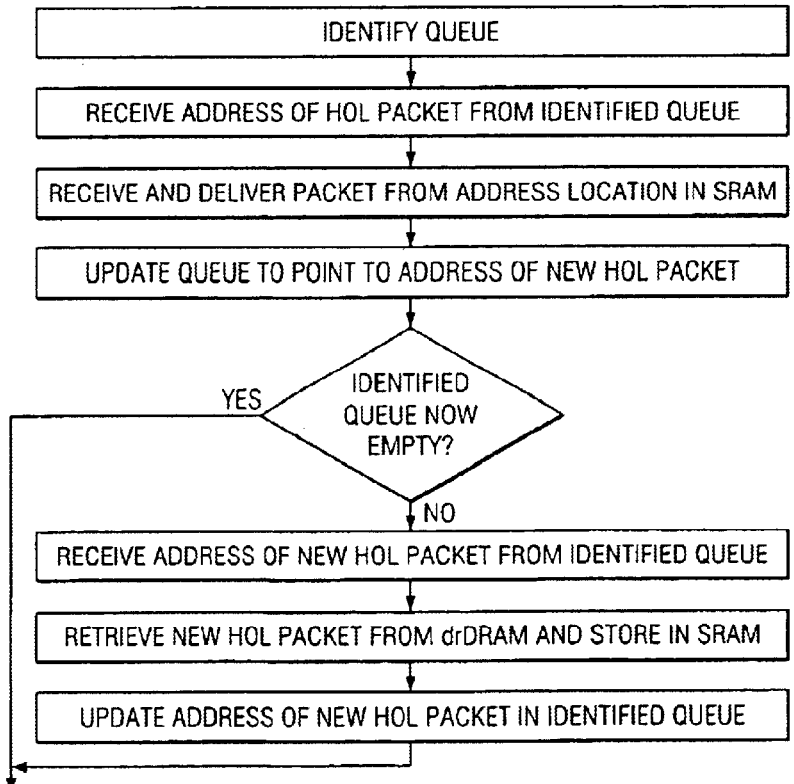
FIG. 4 is a flow diagram for forwarding a stored packet.

FIG. 4 illustrates an operation for forwarding a stored packet to a destination node, in accordance with an exemplary embodiment of the present invention. It is understood that embodiments of the present invention are not necessarily limited to the particular order of steps described below and illustrated in FIG. 4. Rather, the order of steps may be reasonably modified from that described and illustrated.

In this example, a series of packets associated with a particular queue 9 is sequentially retrieved from packet buffer 1 for subsequent transmission to the predetermined destination node. Specifically, the address of the HOL packet is provided by the particular queue 9. With the address of the HOL packet, the HOL packet is retrieved from second memory 5 (SRAM) and placed on the data I/O for subsequent transmission to the destination node. The particular queue 9 is updated to point to the new HOL packet. In the event the particular queue 9 is not empty following it being updated, the address of the new HOL packet may be received and the packet retrieved from first memory 3 (drDRAM) and placed in second memory 5 (SRAM). Further, the new address of the new HOL packet is placed in the particular queue 9 so that the particular queue is able to point to the correct location in second memory 5 where the new HOL packet is stored. At this point, packet buffer 1 is ready to provide another packet for subsequent transmission to a destination node.

The invention being thus described, it will be obvious that the same may be varied in many ways. Such variations are not to be regarded as a departure from the spirit and scope of the invention, and all such modifications as would be obvious to one skilled in the art are intended to be

What is claimed is:

1. A buffer for storing information organized into packets, comprising:
   a destructive-read dynamic random access memory (drDRAM), information stored in the drDRAM being destroyed following the information being read therefrom;
   a random access memory (RAM);
   at least one queue for storing a number of pointers to locations where packets are stored in the drDRAM and the RAM, wherein incoming fanout splitting packets are stored in the RAM and remaining incoming packets are stored in the drDRAM, and the (head-of-line) packet pointed to by the pointer at the top of the at least one queue being automatically read from the drDRAM and stored in the RAM for subsequently providing the packet externally to the buffer.

2. The buffer of claim 1, wherein the RAM is a static random access memory (SRAM).

3. The buffer of claim 1, wherein the RAM is a dynamic random access memory (DRAM), information stored in the DRAM is not destroyed following the information being read therefrom.

4. The buffer of claim 1, wherein the at least one queue comprises a plurality of queues, each queue capable of storing a number of pointers to locations where received packets are stored in the drDRAM and RAM, the head-of-line packet pointed to by the pointer at the top of each queue being automatically read from the drDRAM and stored in the RAM for subsequently providing the packet externally to the buffer.

5. The buffer of claim 1, wherein an incoming packet to the buffer is automatically stored in the RAM in the event the at least one queue is empty.

6. The buffer of claim 1, wherein following the head-of-line packet being read from the buffer, a new head-of-line packet is read from the drDRAM and stored in the RAM if the at least one queue is not empty.

7. The buffer of claim 1, wherein the drDRAM is larger than the RAM.

8. The buffer of claim 1, wherein the drDRAM is organized in rows and columns of memory cells, at least one row being divided into a plurality of groups of memory cells, each group of memory cells being selectively individually addressable.

9. The buffer of claim 1, wherein incoming unicast packets or nonfanout splitting packets are initially automatically stored in the drDRAM.

10. A method of storing packets of information, comprising:
    receiving a packet of information;
    identifying a queue to which the received packet is to be associated;
    determining whether the identified queue is empty; and
    storing the received packet in at least one of a first memory and a second memory based upon the determination of whether the queue is empty.

11. The method of claim 10, further comprising:
    determining whether the received packet is a fanout splitting packet, wherein the step of storing is based upon the determination of whether the received packet is a fanout splitting packet.

12. The method of claim 11, wherein the step of storing comprises storing the received packet in the first memory if the received packet is determined not to be a fanout splitting packet and storing the received packet in the second memory if the received packet is determined to be a fanout splitting packet.

13. The method of claim 10, further comprising:
    determining whether the received packet is a unicast packet or a nonfanout splitting packet, wherein the step of storing is based upon the determination of whether the received packet is a unicast packet or a nonfanout splitting packet.

14. The method of claim 10, wherein the received packet is stored in the first memory based upon a determination that the queue is not empty, and stored in the second memory based upon a determination that the queue is empty.

15. The method of claim 14, further comprising transferring the received packet from the first memory to the second memory upon the received packet becoming the head-of-line packet associated with the queue.

16. A method of handling packets of information, comprising:
   storing a first incoming packet of information in a first memory, the first packet being associated with at least one queue;
   transferring the first packet from a first memory to a second memory upon the first packet becoming the head-of-line packet for the at least one queue; and
   sending the first packet to a telecommunications device following the step of transferring.

17. The method of claim 16, further comprising:
   determining whether a second incoming packet is a fanout splitting packet; and
   storing the second incoming packet in one of the first memory and the second memory based upon the step of determining.

18. The method of claim 17, wherein the step of storing the second incoming packet comprises storing the second incoming packet in the first memory upon the affirmative determination that the second incoming packet is not a fanout splitting packet, and storing the second incoming packet in the second memory upon the affirmative determination that the second incoming packet is a fanout splitting packet.

19. The method of claim 16, further comprising:
   receiving a second incoming packet;
   identifying a queue for containing a pointer for pointing to a location where the second incoming packet is to be stored;
   determining whether the identified queue is empty; and
   storing the second incoming packet in one of the first memory and the second memory based upon the step of determining.

20. The method of claim 16, further comprising:
   receiving a second packet of information;
   determining whether the at least one queue is empty; and
   storing the second packet in the second memory based upon the step of determining.

21. A system, comprising:
   a node for communicating packets of information, including a data buffer for receiving incoming packets of information and selectively storing the packets in a first memory, the data buffer including at least one queue for pointing to locations in the data buffer where the packets are stored, wherein a first packet is transferred from the first memory to a second memory upon the first packet becoming the head-of-line packet for the at least one queue, the node transmitting the first packet from the second memory externally to the node following the first packet being stored in the second memory.

22. The system of claim 21, wherein the first memory comprises a read-once memory in which stored data is destroyed following being read from the first memory a first time.

23. The system of claim 22, wherein the second memory comprises a static random access memory.

24. The system of claim 22, wherein the second memory comprises a dynamic random access memory which performs nondestructive memory read operations.

25. The system of claim 21, wherein an incoming packet is initially stored in the second memory in the event the at least one queue is empty.

* * * * *